United States Patent [19]

Cappelletti

[11] Patent Number: 5,942,004
[45] Date of Patent: *Aug. 24, 1999

[54] DEVICE AND A METHOD FOR STORING DATA AND CORRESPONDING ERROR-CORRECTION INFORMATION

[75] Inventor: Paolo Cappelletti, Milan, Italy

[73] Assignee: STMicroelectronics, S.r.l., Agrate Brianza, Italy

[ * ] Notice: This patent issued on a continued prosecution application filed under 37 CFR 1.53(d), and is subject to the twenty year patent term provisions of 35 U.S.C. 154(a)(2).

[21] Appl. No.: 08/550,557

[22] Filed: Oct. 31, 1995

[30] Foreign Application Priority Data

Oct. 31, 1994 [EP] European Pat. Off. ............... 94830519

[51] Int. Cl.$^6$ .................................................. G11C 29/00
[52] U.S. Cl. ........................... 714/763; 714/702; 714/755; 714/758; 714/761; 714/764; 714/766; 714/765; 714/711; 365/149; 365/201; 320/122
[58] Field of Search ................................. 371/40.11, 38.1, 371/40.3, 2.2, 37.7, 40.2, 37.2, 50.1, 37.4, 40.4; 395/410; 365/185.03, 230.01, 189.01, 201, 149, 185.09; 320/122; 714/711

[56] References Cited

U.S. PATENT DOCUMENTS 3,644,898  2/1972  Post ...................................... 340/172.5
4,335,459  6/1982  Miller ....................................... 371/38
4,691,318  9/1987  Entenman ................................. 371/43
4,958,352  9/1990  Noguchi et al. ........................ 371/40.1

OTHER PUBLICATIONS

Kalter, Howard L. et al., "A 50–ns 16–Mb DRAM with a 10–ns Data Rate and On–Chip ECC", *IEEE Journal of Solid–State Circuits*, vol. 25, No. 5, Oct. 1990, pp. 1118–1127.

"ECC in 512 Bytes Sector Nand–Type Flash Eprom," *IBM Technical Disclosure Bulletin*, vol. 35, No. 7, Dec. 1992, pp. 131–132.

*Primary Examiner*—William Grant
*Assistant Examiner*—McDieunel Marc
*Attorney, Agent, or Firm*—Seed and Berry LLP; David V. Carlson

[57] ABSTRACT

The invention relates to a multi-level storage device including: at least a first plurality of cells storing an identical first number (greater than one) of binary data, and at least a corresponding for second plurality of cells for storing a second number of error check and correcting words equal to said first number, said words being respectively associated with sets of binary data, each including at least one binary data for each cell in said first plurality. In this way, many of the known error correction algorithms can be applied to obtain comparable results to those provided by binary memories. In addition, where multi-level cells are used for storing the error check and correcting words, the device dimension requirements can also be comparable.

26 Claims, 2 Drawing Sheets

DEVICE AND A METHOD FOR STORING DATA AND CORRESPONDING ERROR-CORRECTION INFORMATION

TECHNICAL FIELD

This invention relates to a method for checking and correcting errors in a multi-level memory, a memory device implementing the method, and related read/write methods.

BACKGROUND OF THE INVENTION

The problem of error correction in memories of conventional design has been already addressed heretofore.

U.S. Pat. No. 4,958,352, for example, discloses a semiconductor memory provided with an ECC (Error Check and Correcting) circuit. The memory comprises a first cell matrix for the principal information, and a second cell matrix for the ECC information. Associated with each information word, an 8-bit word in the example, is an error check and correcting word, a 4-bit word in the example, which only allows a single error to be located and corrected (this being generally found adequate). Each bit of binary data is stored in a different one of the memory cells.

Understandably, by providing memory cells which can store, for example, four bits of data, it becomes possible to store, in the instance of the above example, each information word into two cells of the first array and the corresponding error check and correcting word into a cell of the second array.

Using Hamming codes, as the codes which provide single-error check and correcting words of shortest length, the relation $2^M = N+1+M$ applies, where N is the bit length of the information word, and M is the bit length of the ECC word. There are, of course, other code types which allow a larger number of errors to be checked and/or corrected, but they require longer error check and correcting words. The subject is exhaustively dealt with in Jiri Adamek, "Foundations of Coding", John Wiley & Sons, 1991.

Multi-level memories are currently the subject of intensive research work because of the growing demand for semiconductor storage devices of large capacity, in particular non-volatile ones. In memories of this kind, write and/or read errors are much more likely to occur, and steps must be taken to prevent or at least reduce them.

In investigating the operation of multi-level memories, in particular of the EEPROM and Flash EPROM types, it has been found that when a cell is programmed improperly, more than one data bit in that cell are incorrect.

Of course, it would be possible to use a code which allows a large number of errors to be checked and corrected, but this results in the error corrective array attaining impractical dimensions, well in excess of those of the informational matrix.

SUMMARY OF THE INVENTION

It is an object of this invention to provide a method which enables errors in a multi-level storage device to be checked and corrected, fits the error modeling for such memories, and affords good error allowance without expanding the dimensions of the device as compared to prior devices having error correction, where the device is integrated into a chip; another object being the provision of a storage device architecture which can implement the above method.

In a multi-level storage device comprising at least one plurality of cells, each adapted to store an identical first number of binary data, which first number is greater than one, if for each plurality, at least a second number of error check and correcting words is provided which is equal to said first number, and if said words are respectively associated with sets of binary data, each comprised of one binary data for each cell in the plurality, then many of the known error correction algorithms can be applied directly to obtain comparable results to those provided by binary memories.

Furthermore, if multi-level cells are used to store the error check and correcting words, their effect on size is also comparable.

BRIEF DESCRIPTION OF THE DRAWINGS

The invention will be further explained in the following description, to be read in conjunction with the accompanying drawings, in which.

DETAILED DESCRIPTION OF THE INVENTION

Figure 1:
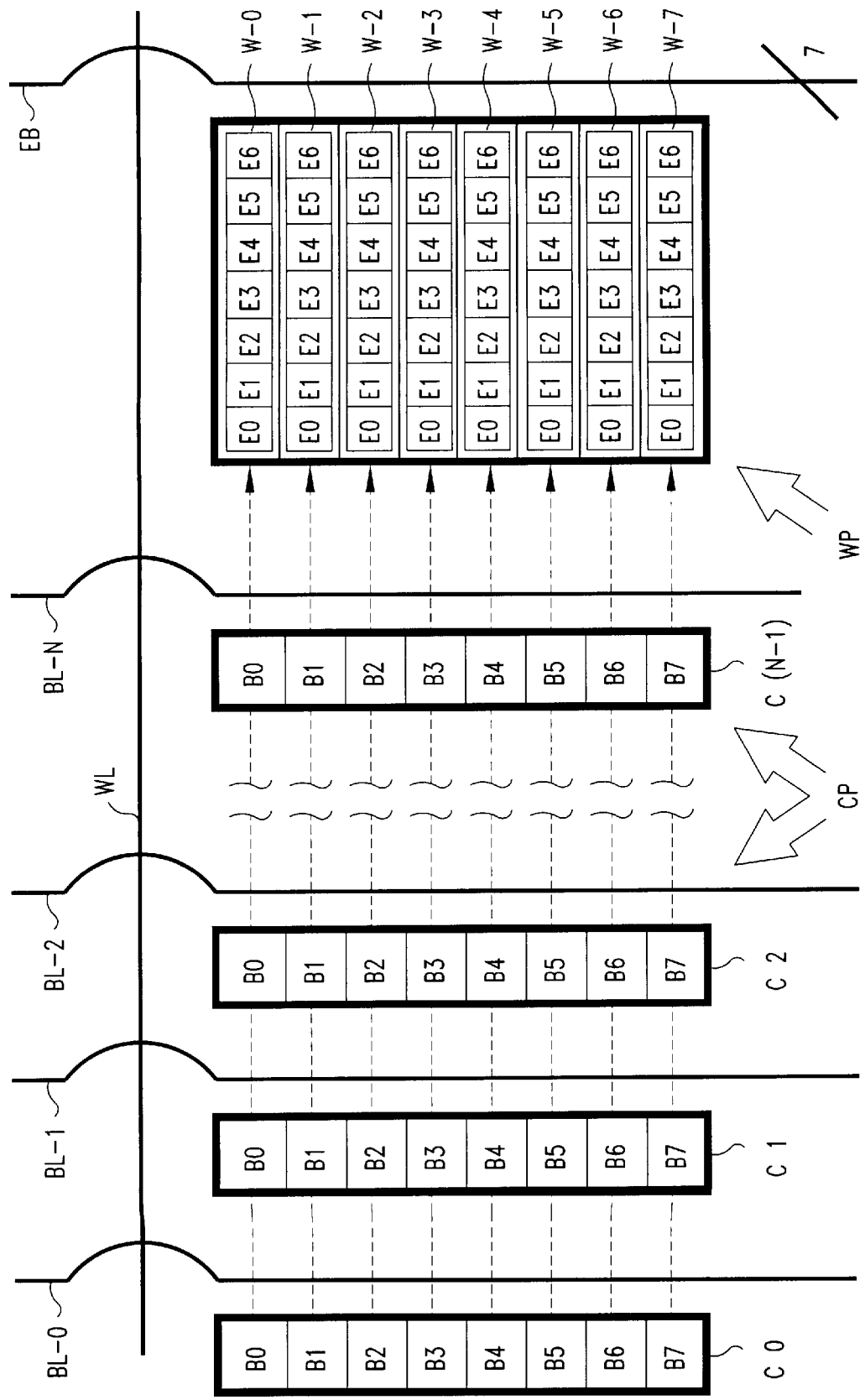
FIG. 1 shows a plurality of multi-level cells and a corresponding number of ECC words, in accordance with the invention.

The method of this invention will now be discussed with reference to FIG. 1. It provides error checking and correcting capabilities in a multi-level storage device of the type which comprises at least one plurality CP of cells C0 . . . C(N–1), each adapted to store an identical first number (eight in FIG. 1) of data bits, e.g., B0 . . . B7. Herein, the term "CP" represents the plurality of cells C0, C1 . . . C(N–1) taken together as a whole (as shown in FIG. 1).

This method consists of providing, for each plurality CP of cells, at least a second number (eight in FIG. 1) of error check and correcting words, e.g., W0 . . . W7. This second number is equal to said first number, and the words W-0 . . . W-7 are respectively associated with sets of data bits, each set including one data bit B0–B7 from each cell CP.

It will be appreciated that there exist several possibilities for selection of the binary information contained in the sets. Lacking any special reasons for doing otherwise, such sets would be discrete sets. Of course, the sets might include several data bits of one or more cells.

The simplest choice would be that of including in the set "0" the binary data B0 of the cells C0 . . . C(N–1) in the plurality CP; in the set "1", the binary data B1 . . . ; and in the set "7", the binary data B7.

The error check and correcting words W-0 . . . W-7 are computed from the associated set by employing an algorithm which permits error checking and correcting in said set. As previously mentioned, there are several codes which can do this. Provided that the number N of the cells CP in a plurality has been suitably selected, the probability of a single error is a reasonable one; in this case the most suitable code (the one requiring the shortest ECC word) is the Hamming code: when N is selected equal to 120, the length of the words W-0 . . . W-7 is 7 bits.

The error check and correcting words can be stored into another plurality WP of cells of a suitable type to store the first number (eight) of data bits; in this case, any additional occupation of the chip area due to the error correction is drastically reduced from conventional devices, in FIG. 1 by a factor of eight. Herein, the term "WP" represents the seven correction cells, taken together as a whole (as shown in FIG. 1), where the first correction cell stores the E0 bit information of the words W-0 ... W-7, the second correction cell stores the E1 bit information of the words W-0 ... W-7, etc.

The error check and correcting words W-0 ... W-7 each include a third number (seven in FIG. 1) of binary data bits E0 ... E6; the other plurality WP of cells may consist of a fourth number (seven in FIG. 1) of cells equal to said third number. In that case, it is convenient if each binary data bit of each word W-0–W-7 is stored into a different cell of the other plurality WP. The straightest choice consists, as shown in FIG. 1, of storing into a first cell of the other plurality WP all of the binary data bits E0 of the words W-0 ... W-7; into a second cell, the binary data bits E1 ...; and into a seventh and last cell, the binary data bits E6. Understandably, there exist other viable options.

The words W-0 ... W-7 could also be stored respectively into eight different multi-level memory cells. In the instance of FIG. 1, such cells would be somewhat underutilized in that information would be stored therein which corresponds to seven binary data bits, whilst their capacity is of eight binary data bits; the eighth binary data bit could be advantageously used for storing the parity of the corresponding error check and correcting word.

In FIG. 1, the cells in the two pluralities CP and WP are depicted as if they belonged to a word line WL of a memory array; each cell C0 ... C(N−1) is associated with a bit line BL-0 ... BL-N; and the words W-0 ... W-7 are associated with an error bus EB formed, in this example, of 7 lines, equal to the length of the words and the number of cells provided for storing them.

Figure 2:
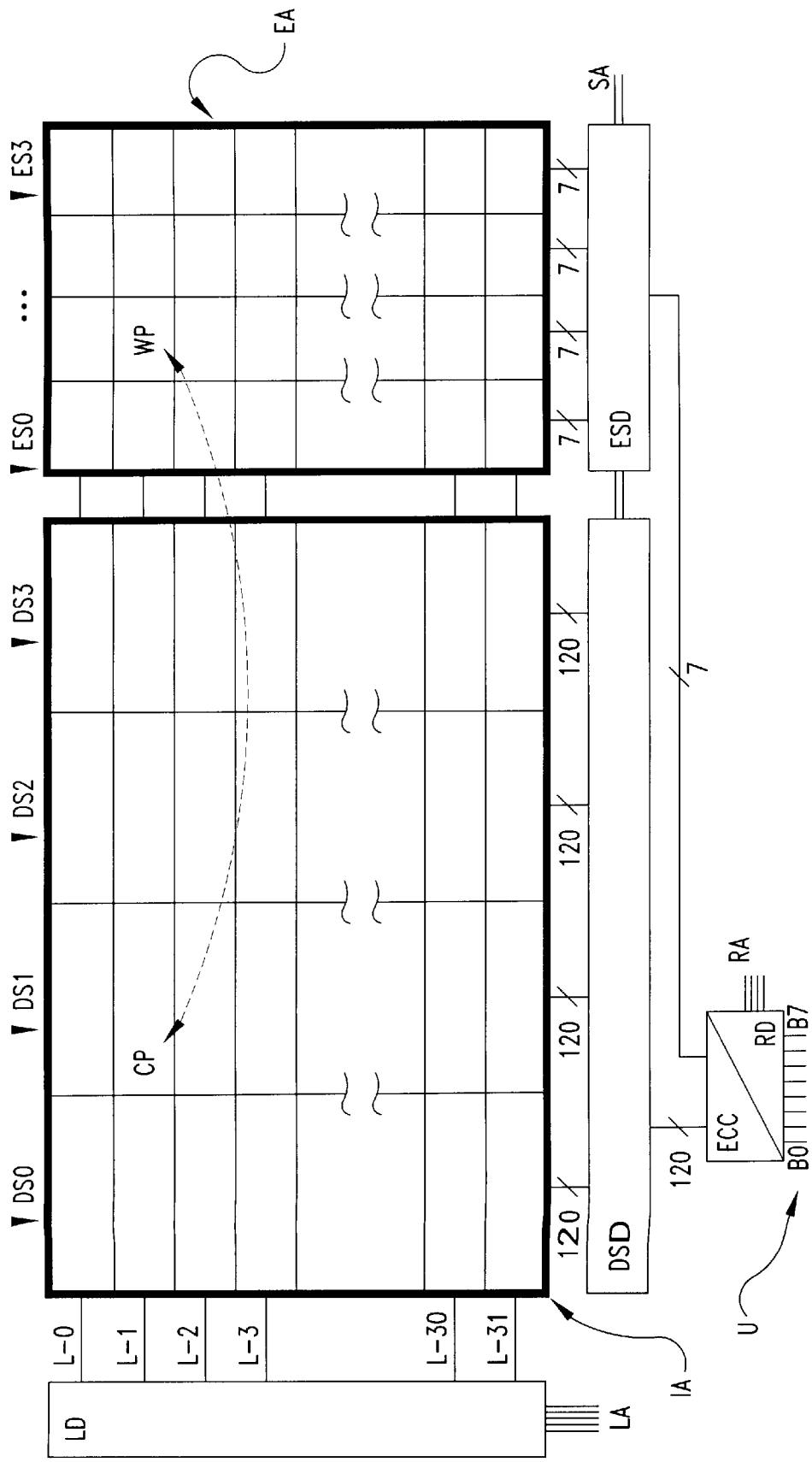
FIG. 2 shows a block diagram for a storage device according to this invention.

With reference now to FIG. 2, where the storage device comprises at least a first array IA of cells arranged in rows and columns, for each row (as in FIG. 2) or column, at least said second number of error check and correcting words are provided, and each row (as in FIG. 2) or column forms a different plurality.

These error check and correcting words may then be stored into a second array EA of cells having the same number of rows (as in FIG. 2) or columns as the first array IA.

A storage device according to this invention will now be described with reference to FIG. 2.

This device basically includes:
a) at least a first plurality CP of cells, each adapted for storing an identical first number of binary data bits, which number is greater than one, and
b) at least a corresponding second plurality WP of cells adapted for storing a second number of error check and correcting words equal to the first number, such words being respectively associated with sets of binary data bits, each set comprised of a binary data bit from each cell in the first plurality CP.

The same considerations made in connection with the method description apply here to the sets.

The device of FIG. 2 comprises plural (here, four) storage sections divided into information storage sections DS0, DS1, DS2, DS3, and error storage sections ES0, ES1, ES2, ES3. Each informational section consists of 32 first pluralities CP of cells and each error section consists of 32 corresponding second pluralities WP of cells, and further includes:
a) a line decoder LD being input a line address LA and outputting 32 line signals L-0 ... L-31;
b) an information section decoder DSD being input 4 groups of 120 bit lines from the information sections DS0, DS1, DS2, DS3 and a section address SA, and outputting one of the four groups of bit lines;
c) an error section decoder ESD being input 4 groups of 7 bit lines from the error sections ES0, ES1, ES2, ES3 and a section address SA, and outputting one of the four groups of bit lines;
d) an ECC circuit connected to the outputs of the decoders DSD and ESD, operative to check and correct any errors appearing in the contents of the cells in a first addressed plurality by the use of the contents of cells in a second addressed plurality, and to generate corrected information; and
e) a column decoder RD being input said corrected information and a column address RA, and being adapted to select, based on this address, some of the corrected information for supplying to the device output U. Herein, the term "RA" represents the column address (as shown in FIG. 2) which is coupled to the column decoder RD.

The cells of the information sections DS0, DS1, DS2, DS3 jointly form an information array IA, while the cells of the error sections ES0, ES1, ES2, ES3 form an error array EA.

Advantageously, all the cells of the arrays IA and EA are adapted for storing the same number of binary data bits, eight in the example of FIGS. 1 and 2.

In the circuit of FIG. 2, each information section DS represents a sub-array of the array IA; each row constitutes a different first plurality CP; each error section ES represents a sub-array of the array EA; each row constitutes a different second plurality WP; for each row in the sub-arrays DS, that is for each first plurality CP, there is a corresponding second plurality WP, this biunivocal relationship being exemplified in FIG. 2 for two particular pluralities by a double-headed arcuate arrow joining two blocks of the arrays IA and EA.

Understandably, in order to read and write a storage device of this type, special methods are required which would depend on its construction.

The method of this invention for reading corrected information in such a multi-level storage device basically includes:
a) entering a read address to said device consisting, in FIG. 2, of a line address LA, a section address SA, and a column address RA;
b) selecting and reading a first plurality CP of cells by coupling the line address LA into the line decoder LD and the section address SA into the information section decoder DSD;
c) selecting and reading a second plurality WP of cells by coupling the line address LA into the line decoder LD and the section address SA into the error section decoder ESD;
d) checking and correcting any errors appearing in the contents of the cells in the first plurality CP by using the contents of the cells in the second plurality WP;
e) generating corrected information; and
f) selecting some of the corrected information for supply on the device output U by coupling the column address RA into the column decoder RD.

The method of this invention for writing correctable information from information to be stored into one such multi-level storage device, basically includes:
a) entering the information to be stored to said device;
b) entering, to said device, a write address consisting, in FIG. 2, of a line address LA, a section address SA, and a column address RA;
c) storing such information into a first plurality CP of cells identified by the write address, specifically in FIG. 2, by the line address LA in combination with the section address SA, at a location specified by the write address, specifically in FIG. 2, by the column address RA;

d) computing error check and correcting words from the contents of the cells in the identified plurality CP; and e) storing said computed words into a second plurality WP of cells identified by the write address, specifically in FIG. 2, by the line address LA in combination with the section address SA.

To revert to the storage device, it should be understood that there are several architectures to implement a traditional storage device, and consequently, there will be many different options for positioning, dimensioning, arranging and addressing the plurality of error check and correcting cells, all of which allow the method according to this invention to be implemented, and each technician will be able to pick up the most suitable option for the basic storage architecture.

It will be appreciated that, although specific embodiments of the invention have been described herein for purposes of illustration, various modifications may be made without departing from the spirit and scope of the invention. For example, the multilevel storage device may be formed with N=128 and M=8. This would allow the information sections DS0, DS1, DS2, and DS3 to include 128 bit lines that carry 16 8-bit bytes of data. An additional storage cell would be needed to store the error check and correcting words W-0–W-7, which would now each include 8 bits E0–E7. Accordingly, the invention is not limited except as by the appended claims.

I claim:

1. A memory device, comprising:

an address decoder;

a data storage matrix that is coupled to said address decoder and that includes multiple elementary data storage cells that are each operable to store a respective first plurality of data bits; and a correction storage matrix that is coupled to said address decoder and that is operable to store a second plurality of correction words that are each associated with a respective one of a third plurality of sets of said data bits, said third plurality of sets each including a respective one of said data bits from each of said data storage cells, said second plurality being equal to said third plurality.

2. The memory device of claim 1 wherein:

said correction words each include a respective fourth plurality of correction bits; and said correction storage matrix comprises a fifth plurality of correction storage cells that are each operable to store a respective one of said correction bits form each of said correction words.

3. The memory device of claim 2 wherein said correction storage cells are each operable to store one and only one of said correction bits from each of said correction words.

4. The memory device of claim 1 wherein said first plurality is equal to said second and third pluralities.

5. The memory device of claim 1 wherein each of said sets of data bits includes one and only one data bit from each of said data storage cells.

6. The memory device of claim 1 wherein each of said sets of data bits includes at least one data word.

7. The memory device of claim 1 wherein each of said correction words allows detection and correction of an error in an associated one of said sets of data bits.

8. A method for storing data, comprising:

storing a respective first plurality of data bits in each of multiple elementary data storage cells;

defining a second plurality of sets that each include one of said data bits from each of said data storage cells; and associating a respective correction word with each one of said sets.

9. The method of claim 8 further comprising:

including in each of said correction words a third plurality of correction bits; and storing one of said correction bits from each of said correction words in each of a fourth plurality of correction storage cells.

10. The method of claim 8 wherein said first plurality is equal to said second plurality.

11. The method of claim 8 further comprising generating each of said correction words from said data bits of an associated one of said sets.

12. The method of claim 8 further comprising generating each of said correction words from said data bits of an associated one of said sets using a Hamming code.

13. A method for checking and correcting errors in a multi-level storage device of the type which comprises at least one plurality of elementary cells each adapted for storing a respective identical first number of binary data, said first number being greater than one, characterized in that, for each plurality of cells, at least a respective second number of error check and correcting words is provided which is equal to said first number, and that said correcting words are respectively associated with respective sets of binary data, each set comprising a respective one binary data of each cell in said plurality of cells.

14. A method according to claim 13, wherein said sets may comprise several binary data of one or more cells.

15. A method according to claim 13, wherein said error check and correcting words are computed from the associated set using an algorithm which allows of checking and correcting a single error in said set.

16. A method according to claim 13, wherein said error check and correcting words are stored into another cell plurality of the type adapted for storing said first number of binary data.

17. A method according to claim 16, wherein said error check and correcting words are composed of a third number of binary data wherein said other plurality is composed of a fourth number of cells equal to said third number, and wherein each binary data of each word is stored into a different cell in said other plurality.

18. A method according to claim 13, wherein said storage device comprises at least a first array of cells arranged in rows and columns; wherein for each row and/or column, at least said second number of error check and correcting words is provided; and wherein each row and/or column constitutes a different plurality.

19. A method according to claim 18, wherein said error check and correcting words are stored into a second array of cells having the same number of rows and columns as said first array.

20. A multi-level storage device, comprising:

a) at least a first plurality of cells, each adapted for storing a respective identical first number of binary data, said first number being greater than one; and b) at least a corresponding second plurality of cells adapted for storing a second number of error check and correcting words equal to said first number, said correcting words being respectively associated with sets of binary data, each set including a respective binary data of each cell in said first plurality.

21. A device according to claim 20, comprising plural storage sections consisting of at least said first plurality and said corresponding second plurality of cells, and further comprising:

a) first decoder means operative to select and read the first plurality of an addressed section in said plurality of sections;

b) second decoder means operative to select and read the second plurality of said addressed section;

c) error check and correcting means connected to the outputs of said first and second decoder means, operative to check and correct any errors appearing in the contents of the cells in the addressed first plurality by the use of the contents of the cells in the addressed second plurality, and to generate corrected information; and d) third decoder means operative to select, based on an address, some of said corrected information and to supply it on the device output.

22. A device according to claim 20, wherein the cells in said second plurality are adapted for storing an identical first number of binary data, said first number being greater than one.

23. A device according to claim 20, comprising at least a first array of cells arranged in rows and columns, wherein each row and/or column constitutes a different first plurality, and wherein a corresponding second plurality is provided for each row and/or column.

24. A device according to claim 23, further comprising a second array of cells having the same number of rows and columns as said first array, and adapted for storing said error check and correcting words.

25. A method for reading corrected information in a multi-level storage device as claimed in claim 20, comprising the steps of:

a) entering a read address to said device, b) based on said address, selecting and reading a first plurality of cells;

c) based on said address, selecting and reading a second plurality of cell;

d) checking and correcting any errors appearing in the contents of the cells in said first plurality by using the contents of the cells in said second plurality;

e) generating corrected information; and f) based on said address, selecting some of said corrected information for supply on the device output.

26. A method for writing correctable information from information to be stored into a multi-level storage device as claimed in claim 20, comprising the steps of:

a) entering the information to be stored to said device;

b) entering a write address to said device;

c) storing said information into a first plurality of cells identified by said address at a specified location by said address;

d) computing error check and correcting words from the contents of the cells in said identified plurality; and e) storing said computed words into a second plurality of cells as identified by said address.

* * * * *